United States Patent [19]

Tanuma

[11] Patent Number: 4,608,506
[45] Date of Patent: Aug. 26, 1986

[54] TEMPERATURE COMPENSATED DRIVE FOR A PIEZOELECTRIC DISPLACEMENT GENERATOR

[75] Inventor: Chiaki Tanuma, Tokyo, Japan

[73] Assignee: Tokyo Shibaura Denki Kabushiki Kaisha, Kawasaki, Japan

[21] Appl. No.: 592,542

[22] Filed: Mar. 22, 1984

[30] Foreign Application Priority Data

Mar. 31, 1983 [JP] Japan .................................. 58-53772

[51] Int. Cl.$^4$ ............................................. H01L 41/08
[52] U.S. Cl. .................................... 310/315; 310/317; 310/332
[58] Field of Search ................... 310/315, 317, 330–332

[56] References Cited

U.S. PATENT DOCUMENTS

| | | | |
|---|---|---|---|
| 1,840,580 | 1/1932 | Heising | 310/315 X |
| 2,157,665 | 5/1939 | Hollmann | 310/315 |
| 2,166,763 | 7/1939 | Mason | 310/317 X |
| 3,185,869 | 5/1965 | Shoor | 310/315 |
| 3,646,413 | 2/1972 | Oomen | 310/331 X |
| 4,013,845 | 3/1977 | Sugimoto et al. | |

FOREIGN PATENT DOCUMENTS 2394203 10/1936 France .
57-208418 12/1982 Japan .

Primary Examiner—Mark O. Budd
Attorney, Agent, or Firm—Oblon, Fisher, Spivak, McClelland & Maier

[57] ABSTRACT

A displacement generation device includes: a bimorph piezoelectric vibrator for receiving an externally applied drive voltage and for generating a displacement in response to the drive voltage; and a temperature-compensation capacitor element electrically connected in series with the piezoelectric vibrator. The capacitor element has a capacitance with a temperature coefficient with the same absolute value but opposite sign to that of the capacitance of the piezoelectric vibrator. When the capacitance of the piezoelectric vibrator changes in accordance with a change in the ambient temperature, the capacitor element properly changes the drive voltage supplied to the piezoelectric vibrator, thereby compensating for the displacement of the piezoelectric vibrator caused by the change in ambient temperature.

14 Claims, 7 Drawing Figures

F I G. 1
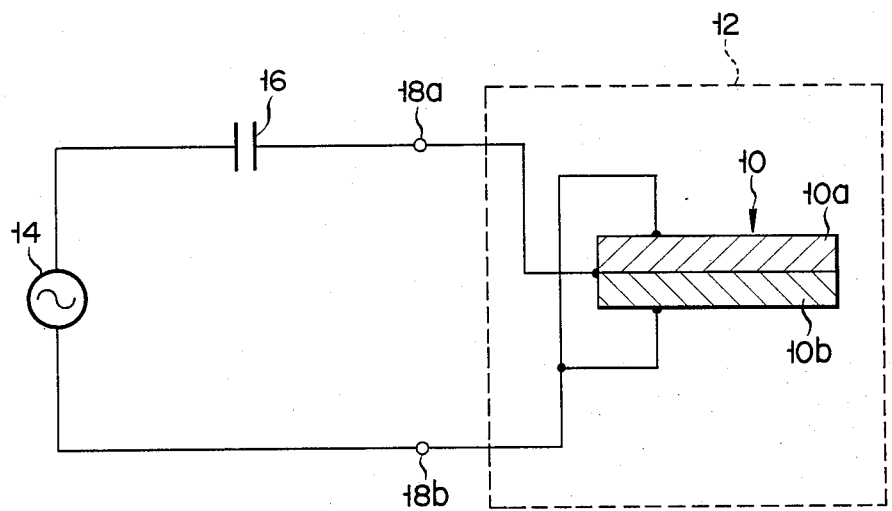
F I G. 2
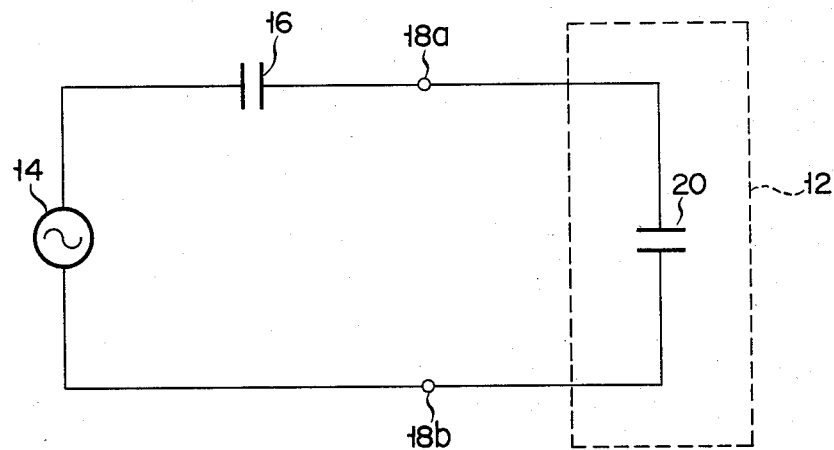

F I G. 4
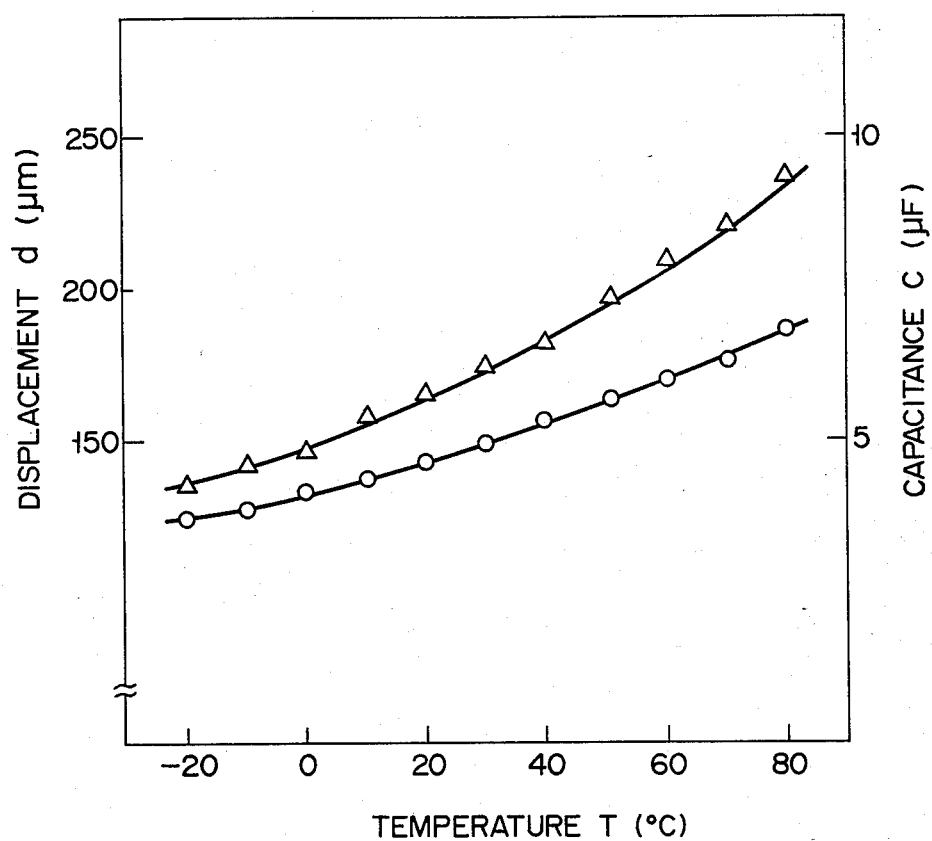

F I G. 6
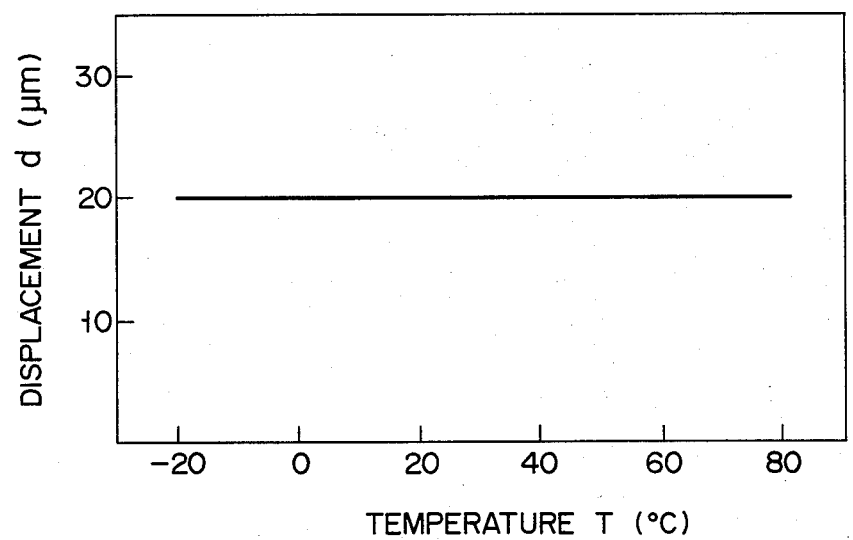

F I G. 7
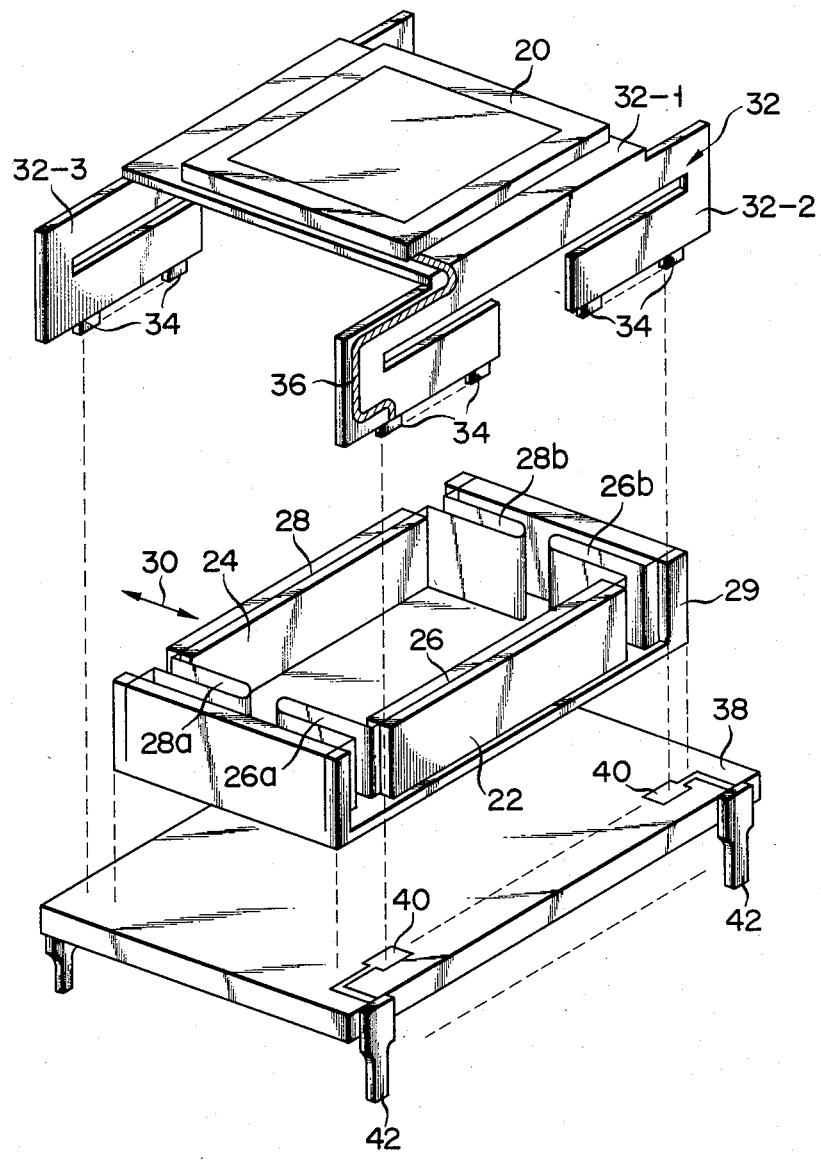

TEMPERATURE COMPENSATED DRIVE FOR A PIEZOELECTRIC DISPLACEMENT GENERATOR

BACKGROUND OF THE INVENTION

The present invention relates in general to a displacement generation device using a piezoelectric displacement element having a piezoelectric effect for generating a distortion upon a change in an applied voltage and, in particular, to a displacement generation device using a piezoelectric displacement element which vibrates in response to a control voltage signal to achieve a desired vibration mode.

A bimorph cell is generally known as one of the typical elements which has a piezoelectric effect. The bimorph cell comprises piezoelectric plates which are cemented together in a stacked manner. The bimorph cell may be constructed such that piezoelectric plates are bonded to a metal plate or the like. The piezoelectric element of this type is effectively used as a means for generating a slight periodic displacement in accordance with a change in an applied voltage, and is applied in a variety of fields. For example, the bimorph cell of this type is used as a laser beam deflection element in an optical video disk system or as a video head displacement element in a helical scan type VTR. In the optical video disk system, a mirror is mounted at the distal end of the bimorph cell. When a proper voltage signal is applied to this piezoelectric element, the cell is distorted changing the position of a mirror so as to deflect the laser beam. In the helical scan type VTR, the bimorph cell causes proper displacement of the video head, thereby performing auto-tracking.

In a special application of the bimorph cell, a deflection unit is proposed to periodically change the light-receiving position of a solid-state image sensor such as a charge-coupled device (CCD) with respect to an incoming optical image so as to obtain a high-resolution image. A deflection unit of an interline transfer type solid-state image sensor is disclosed in U.S. patent application Ser. No. 484,511 by Chiaki TANUMA et al. According to this reference, a light-receiving surface of the CCD is displaced or vibrated by a bimorph cell at a proper resonance frequency with respect to the incident image beam. The number of picture elements obtained by the CCD can be effectively increased. Therefore, without actually increasing the number of picture elements of the CCD, a high-quality image can be obtained.

However, the actual displacement of the bimorph cell changes in accordance with its ambient temperature and the type of piezoelectric material used. However, a temperature coefficient of the displacement falls within the range of 2,000 to 10,000 ppm/°C. ($-20°$ C. to $60°$ C.). For example, when the solid-state image sensor is mounted in a VTR camera, an electronic camera or the like, the temperature changes in accordance with the given circumstances. When the temperature changes, the displacement also changes, as described above. As a result, the desired displacement cannot be obtained, resulting in inconvenience. Therefore, a high-resolution image cannot be obtained when a bimorph cell is used in the deflection device of a solid-state image sensor.

SUMMARY OF THE INVENTION

It is therefore an object of the present invention to provide a new and improved displacement generation device capable of stably generating a periodic displacement irrespective of change in the ambient temperature.

The present invention provides a displacement generation device which comprises: a piezoelectric displacement element for receiving an externally applied drive voltage and for generating a displacement in response to the drive voltage; and an electrical element connected in a series with said piezoelectric displacement element and having a temperature coefficient of an electrostatic capacitance which has a polarity opposite to that of the electrostatic capacitance of said piezoelectric displacement element. The electrical element properly changes the drive voltage applied to the piezoelectric displacement element when the electrostatic capacitance of the piezoelectric displacement element changes in accordance with a change in temperature, thereby compensating for the displacement of the piezoelectric displacement element which is caused by the change in temperature.

BRIEF DESCRIPTION OF THE DRAWINGS

The present invention is best understood by reference to the accompanying drawings, in which:

FIG. 1 is a circuit diagram showing a displacement generation device according to an embodiment of the present invention;

FIG. 2 is a circuit diagram of an equivalent circuit of the displacement generation device of FIG. 1;

FIGS. 3 to 6 respectively are graphs showing the displacement and the temperature characteristic of the electrostatic capacitance of the displacement generation device of FIG. 1; and FIG. 7 is a perspective view showing the overall configuration of a displacement generation device for swinging a solid-state charge-coupled device (CCD) to obtain a high-resolution image according to another embodiment of the present invention.

DETAILED DESCRIPTION OF THE PREFERRED EMBODIMENTS

Figure 3:
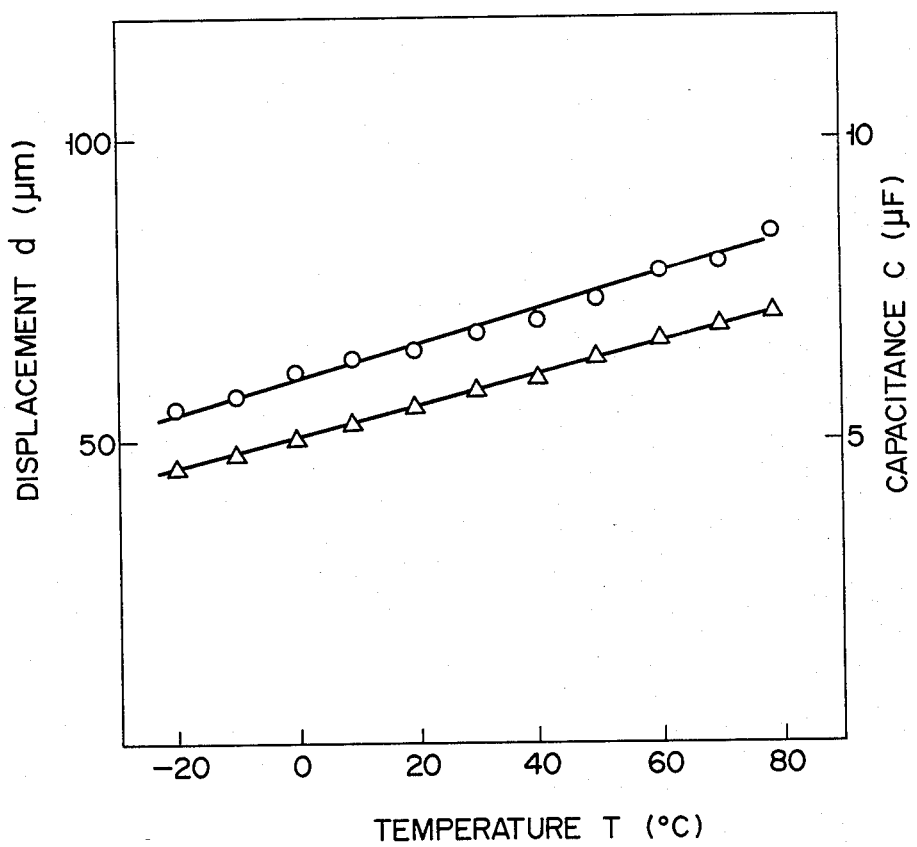

FIG. 1 illustrates a displacement generation device having a temperature compensation function according to an embodiment of the present invention. In this embodiment, a bimorph vibrator 10 is used to constitute a component 12 for generating a periodic displacement. The bimorph vibrator 10 is comprised of two plate-like piezo-electric elements 10a and 10b which are firmly stacked at opposing surfaces thereof, thereby constituting a parallel-connected vibrator. Each plate 10a or 10b is made of a proper piezoelectric material and has a thickness of 0.2 mm, a length of 23 mm and a width of 5 mm. Each piezoelectric plate 10a or 10b is polarized along the direction of thickness thereof. The piezoelectric plates 10a and 10b have the same polarization direction.

An AC power source 14 is provided to feed the bimorph vibrator 10. The power source 14 has an internal impedance which is sufficiently smaller than the impedance of the bimorph vibrator 10. The AC power source 14 is connected to the bimorph vibrator 10 through a temperature-compensation electrical element, for example, a capacitor element 16. One terminal of the AC power source 14 is connected, through the capacitor 16 and a first input terminal 18a, to an adhesion surface of the piezoelectric plates 10a and 10b of the bimorph vibrator 10. The other terminal of the AC power source 14 is connected through a second input terminal 18b to the exposed surfaces of the piezoelectric plates 10a and 10b.

FIG. 2 shows an electrical equivalent circuit of the displacement generation device of FIG. 1. Referring to FIG. 2, a displacement generation section 12 comprising the bimorph vibrator 10 is equivalently represented as a capacitor 20 having a predetermined capacitance. In this embodiment, temperature coefficients of an electrostatic capacitance Cp and a displacement d of the bimorph vibrator were 5,000 ppm/°C., and the temperature coefficient $\alpha_{C1}$ of the temperature-compensation capacitor 16 having an electrostatic capacitance C1 was set to be $-5,000$ ppm/°C. At the same time, the electrostatic capacitance C1 was set to be substantially the same as the capacitance Cp of the bimorph vibrator at room temperature.

The physical theory of the circuit having the above arrangement will be described below.

A piezoelectric material used for a bimorph piezoelectric element must have a large piezoelectric constant $\alpha_{31}$, a large coupling coefficient $K_{31}$ and sufficient mechanical strength. For example, a PZT (Pb(Zr, Ti)O$_3$) based binary system piezoelectric material and suitable ternary system piezoelectric materials may be used as piezoelectric materials. The ternary system piezoelectric materials include a Pb(Y$_\frac{1}{2}$, Nb$_\frac{1}{2}$)O$_3$—(Pb, Sr)TiO$_3$—PbZrO$_3$ based material, a Pb(Co$_\frac{1}{2}$, W$_\frac{1}{2}$)O$_3$—Pb(Ti, Zr)O$_3$ based material, a Pb(Mg$_\frac{1}{2}$, Nb$_\frac{1}{2}$)O$_3$—Pb(Ti, Zr)O$_3$ based material, a Pb(Sb$_\frac{1}{2}$, Nb$_\frac{1}{2}$)O$_3$—Pb(Ti, Zr)O$_3$ based material, and a Pb(Zn$_\frac{1}{2}$, Nb$_\frac{1}{2}$)O$_3$ based and Pb(La$_\frac{1}{2}$, Nb$_\frac{1}{2}$) based material. In particular, a morphotropic phase boundary material has good piezoelectric characteristics.

It is generally known that the displacement of a bimorph piezoelectric element using one of the piezoelectric materials described above changes in accordance with a change in temperature. The bimorph piezoelectric element has an electrostatic capacitance since voltage is applied to the piezoelectric material serving as a dielectric material. The capacitance of the piezoelectric material changes in accordance with a change in the ambient temperature. In extensive studies by the present inventor, it was discovered that the temperature coefficient of the displacement was substantially the same as that of the capacitance. It was also discovered that this tendency does not depend on the shape (length, width and thickness) of the bimorph piezoelectric element.

Figure 5:
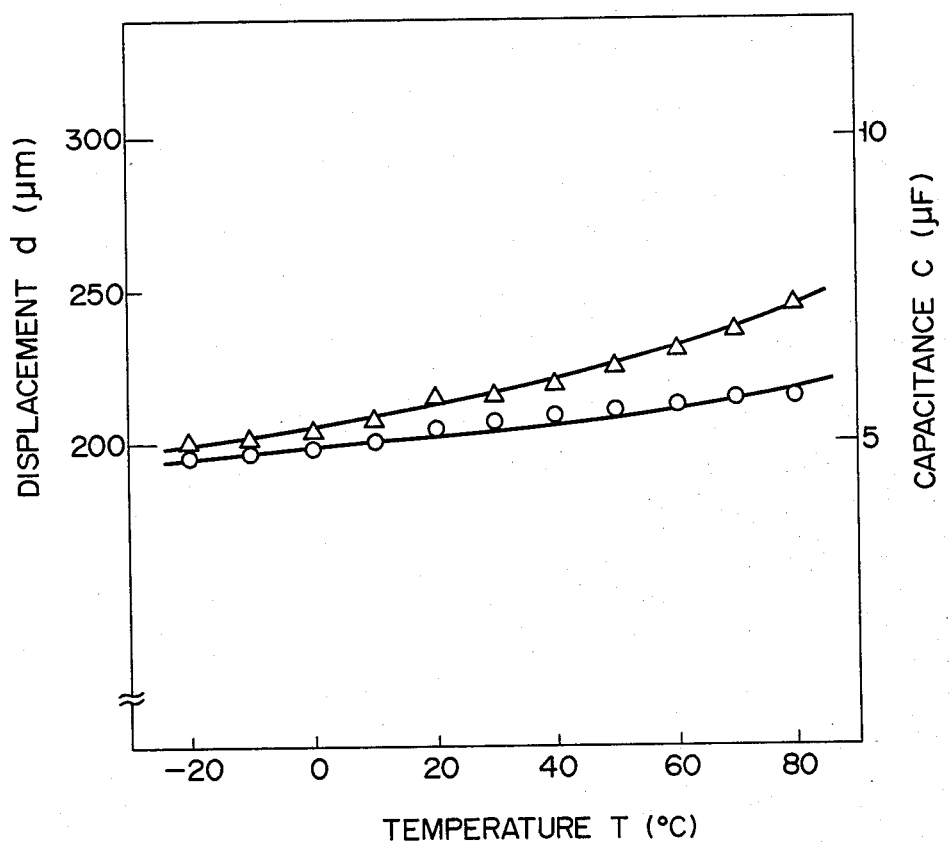

FIGS. 3 to 5 respectively are graphs showing changes in the displacement d and the capacitance C in accordance with a change in temperature T. A drive voltage of between 0 and 200 V (f=30 Hz or 60 Hz) was applied. This voltage corresponded to an electric field of 0 to 1 kV/mm. The graph of FIG. 3 shows data obtained when a Pb(Y$_\frac{1}{2}$, Nb$_\frac{1}{2}$)O$_3$—(Pb, Sr)TiO$_3$—PbZrO$_3$ based material (T-96 available from TOSHIBA CERAMICS CO., LTD) was used. The graph of FIG. 4 shows data obtained when a Pb(Co$_\frac{1}{2}$, W$_\frac{1}{2}$)O$_3$—Pb(Ti, Zr)O$_3$ based material (T-85 available from TOSHIBA CERAMICS CO., LTD) was used. The graph of FIG. 5 shows data obtained when a Pb(Y$_\frac{1}{2}$, Nb$_\frac{1}{2}$)O$_3$—(Pb, Sr)TiO$_3$—PbZrO$_3$ based material (an improved material of T-96) was used.

The temperature coefficient $\alpha_S (=S^{-1} \cdot \partial S/\partial T)$ of the displacement d, and the temperature coefficient $\alpha_C$ $(=C^{-1} \cdot \partial C/\partial T)$ of the capacitance C of the sample shown in FIG. 3 were 5,100 ppm/°C. and 4,800 ppm/°C., respectively; those of the sample shown in FIG. 4 were 6,300 ppm/°C. and 6,000 ppm/°C., respectively; and those of the sample shown in FIG. 5 were 2,800 ppm/°C. and 2,500 ppm/°C., respectively. In this manner, the temperature coefficients $\alpha_S$ and $\alpha_C$ of the displacement d and the capacitance C have substantially the same values. The same results are obtained for any other piezoelectric material. Since the piezoelectric materials are used at a lower temperature than the Curie temperature, the different piezoelectric materials show substantially the same tendency at temperatures lower than the Curie temperature.

When a temperature change occurs that increases the displacement of the bimorph vibrator, the electrostatic capacitance thereof is also increased. In this case, the series-connected capacitor has a temperature coefficient with the opposite sign to that of the displacement (or capacitance), so that the capacitance of the capacitor is decreased. Therefore, the voltage applied to the bimorph piezoelectric element is decreased to decrease the displacement. On the other hand, when the temperature change occurs that decrease the displacement of the bimorph vibrator, the capacitance is increased, thereby increase the displacement.

A capacitor having the temperature coefficient of the opposite sign to that of the capacitance of the bimorph piezoelectric element may be used to obtain a satisfactory effect. In addition, when the temperature coefficient $\alpha_{C1}$ of the capacitance of the capacitor satisfies the following relation:

$$\alpha_{C1} = -\frac{C1(T0)}{C(T0)} \cdot \alpha_C$$

where
  $\alpha_C$: the temperature coefficient of the capacitance of the bimorph piezoelectric element
  T0: the reference temperature
  C1(T0): the capacitance of the capacitor at T0
  C(T0): the capacitance of the bimorph piezoelectric element at T0, and also satisfies the following relation:

$$\alpha_{C1} = -\frac{C1(T0)}{C(T0)} \cdot \alpha_S$$

where
  $\alpha_S$: the temperature coefficient of the displacement of the bimorph piezoelectric element
  T0: the reference temperature
  C1(T0): the capacitance of the capacitor at T0
  C(T0): the capacitance of the bimorph piezoelectric element at T0, a better piezoelectric effect can be obtained.

Desired capacitance and temperature coefficients of the capacitor can be obtained by properly selecting a dielectric material used therefor. For example, it is known that a ceramic capacitor can have a large dielectric constant and can have any temperature coefficient when a metadielectric layer having the Curie temperature lower than the room temperature is used. Further, it is also possible to prepare a capacitor having the desired electrical characteristics, when a specific material such as a dielectric material obtained by adding various additives to BaTiO$_3$ or Pb(Mg$_{1/3}$, Nb$_{2/3}$)O$_3$ is used.

When a voltage V0 is applied to a series circuit of a bimorph piezoelectric element (of capacitance C) and to a capacitor (of capacitance C1), the voltage V applied to the bimorph piezoelectric element is given as follows:

$$V = \frac{C1}{C1+C} \cdot V0 \quad (1)$$

A displacement $\delta$ of the bimorph piezoelectric element is given as follows:

$$\delta = S \cdot V \quad (2)$$

where S is the piezoelectric compliance. A change in the displacement upon a change in the temperature T is given in accordance with equations (1) and (2) as follows:

$$\log V = \log C1 - \log(C1+C) + \log V0 \quad \text{(from (1))}$$

therefore, $$\frac{1}{V} \cdot \frac{\partial V}{\partial T} = \frac{C}{C1+C} \cdot \left[ \frac{1}{C1} \cdot \frac{\partial C1}{\partial T} - \frac{1}{C} \cdot \frac{\partial C}{\partial T} \right] \quad (3)$$

and $$\log \delta = \log S + \log V \quad \text{(from (2))}$$

therefore, $$\frac{1}{\delta} \cdot \frac{\partial \delta}{\partial T} = \frac{1}{S} \cdot \frac{\partial S}{\partial T} + \frac{1}{V} \cdot \frac{\partial V}{\partial T} \quad (4)$$

According to equations (3) and (4), $$\frac{1}{\delta} \cdot \frac{\partial \delta}{\partial T} = \frac{1}{S} \cdot \frac{\partial S}{\partial T} + \frac{C}{C1+C} \cdot \left[ \frac{1}{C1} \cdot \frac{\partial C1}{\partial T} - \frac{1}{C} \cdot \frac{\partial C}{\partial T} \right] \quad (5)$$

Now assume that $\alpha_\delta \stackrel{\Delta}{=} \frac{1}{\delta} \cdot \frac{\partial \delta}{\partial T}$ : the temperature coefficient of the bimorph piezoelectric element after the capacitor is connected in a series therewith $\alpha_S \stackrel{\Delta}{=} \frac{1}{S} \cdot \frac{\partial S}{\partial T}$ : the temperature coefficient of the bimorph piezoelectric element before the capacitor is connected in a series therewith $\alpha_C \stackrel{\Delta}{=} \frac{1}{C} \cdot \frac{\partial C}{\partial T}$ : the temperature coefficient of the capacitance of the bimorph piezoelectric element before the capacitor is connected in a series therewith $\alpha_{C1} \stackrel{\Delta}{=} \frac{1}{C1} \cdot \frac{\partial C1}{\partial T}$ : the temperature coefficient of the capacitance of the capacitor, equation (5) is rewritten as follows:

$$\alpha_\delta = \alpha_S + \frac{C}{C1+C}(\alpha_{C1} - \alpha_C) \quad (6)$$

In order to eliminate the change in displacement of the bimorph piezoelectric element which is caused by a change in temperature, the temperature coefficient $\alpha_\delta$ must become zero. When the relation $\alpha_S \simeq \alpha_C$ is used, the following relations by using equation (6) can be obtained:

$$\alpha_{C1} = -\frac{C1}{C} \cdot \alpha_C \quad (7)$$

$$\alpha_{C1} = -\frac{C1}{C} \cdot \alpha_S \quad (8)$$

The capacitances C1 and C can be expressed as follows:

$$C1(T) = C1(T0) + C1(T0) \cdot \alpha_{C1} \cdot \Delta T \quad (9)$$

$$C(T) = C(T0) + C(T0) \cdot \alpha_C \cdot \Delta T \quad (10)$$

As previously described, the temperature coefficient $\alpha_C$ is as small as 2,000 to 10,000 ppm/°C., and can be given as follows:

$$\alpha_{C1} = -\frac{C1(T0)}{C(T0)} \cdot \alpha_C \quad (11)$$

$$= -\frac{C1(T0)}{C(T0)} \cdot \alpha_S \quad (11')$$

When a capacitor having the temperature coefficient $\alpha_{C1}$ is used, the change in displacement caused by the change in temperature becomes substantially zero.

When an allowable tolerance at a temperature difference $\Delta T$ is 100·a %, the following inequality must be satisfied:

$$-a \leq \Delta T \cdot \alpha_\delta \leq a \quad (12)$$

According to equation (6)

$$-(a/\Delta T)(C1+C) \leq C1\alpha_C + C\alpha_{C1} \leq (a/\Delta T)(C1+C) \quad (13)$$

When the same calculation as in equation (11) is performed, the following inequality must be satisfied $$-\frac{C1(T0)}{C(T0)} \cdot \alpha_C - \frac{a}{\Delta T}\left(1 + \frac{C1(T0)}{C(T0)}\right) \leq \alpha_{C1} \leq \quad (14)$$

$$-\frac{C1(T0)}{C(T0)} \cdot \alpha_C + \frac{a}{\Delta T}\left(1 + \frac{C1(T0)}{C(T0)}\right)$$

For example, if $C1(T0) \simeq C(T0)$, the inequality $-\alpha_C - 2a/\Delta T \leq \alpha_{C1} \leq -\alpha_C + 2a/\Delta T$ must be satisfied. In addition, if a is given a value below $\Delta T \cdot \alpha_S$, the temperature compensation effect of the capacitor can effectively occur.

The same consideration can be applied to other electrical elements such as inductors and resistors. In particular, it is preferable to use a capacitor. Because when a resistor or inductor is used, high impedance and large change therein are required. In addition to this disadvantage, the frequency component of the drive voltage is left, resulting in inconvenience.

According to the displacement generation device arranged to embody the present invention on the basis of the above theory, when a drive voltage of 200 V (peak voltage) at a 30 Hz frequency was applied to the displacement generation section 12 made of the bimorph piezoelectric element or the bimorph vibrator, the present inventor found that the displacement of the bimorph vibrator 10 became constant, irrespective of any change in ambient temperature. FIG. 6 shows the displacement vs ambient temperature characteristics of the embodiment of FIG. 1. As is apparent from FIG. 6, even if the ambient temperature was changed by 100 degrees (from −20° C. to +80° C.), the displacement d obtained by the bimorph vibrator 10 was substantially constant.

According to the displacement generation device having the bimorph piezoelectric element of the present invention, the temperature-compensation capacitor, whose temperature coefficient of the capacitance Cp has the same absolute value but has the opposite sign to that of the equivalent capacitance (and displacement) of the bimorph vibrator, is electrically connected in series with the bimorph vibrator. By this simple arrangement and without an additional temperature compensation unit such as a complex external electronic circuit, the temperature compensation of the displacement of the vibrator can be effectively performed. According to the present invention, when the electrical element is connected to the displacement generation section consisting of the bimorph piezoelectric element, the change in capacitance of the displacement generation section caused by the change in ambient temperature of the displacement generation section can be compensated for and kept substantially constant since the drive voltage supplied to the bimorph vibrator is stably supplied for the electrical element in accordance with the change in capacitance of the bimorph vibrator caused by the change in temperature.

Referring to FIG. 7, there is schematically illustrated a displacement generation device as an example of an application in vibrating or swinging a solid-state image sensor such as an area charge-coupled device (CCD) relative to the incoming optical image. Referring to FIG. 7, an interlace transfer type charge-coupled device 20 (referred to as an IIT-CCD1 hereinafter) which has an ordinary number (for example, 500×400) of picture elements is arranged to be vibrated or swung relative to the incident image beam, by two rectangular plate-shaped bimorph piezoelectric elements 22 and 24. The IT-CCD 20 periodically changes its position, that is, vibrates relative to the incoming optical image. When one frame consists of a plurality of fields, the piezoelectric elements 22 and 24 periodically vibrate the IT-CCD 20 in such a manner as to cause it to occupy different image pickup positions while different field periods are included in one frame period. Accordingly, the number of picture elements of an image thus picked up by the IT-CCD 20 which makes the aforementioned specific vibration mode is substantially increased, thereby producing a highly precise image without increasing the actual number of picture elements of the IT-CCD 20 itself.

The arrangement of the position displacement generation device for vibrating or swinging the IT-CCD 20 will now be described with reference to FIG. 7. The piezoelectric elements 22 and 24 are made of a conventionally known PZT ternary system piezoelectric ceramic. Each piezoelectric plate was made by cementing together two piezoelectric ceramic plates of a predetermined size. Elastic support plates 26 and 28 were made of thin nickel plates which have a predetermined size to maximize their displacement. The support plate 26 has two arcuate portions 26a and 26b at both ends thereof, which serve as springs, while the support plate 28 also has similar arcuate portions 28a and 28b. The piezoelectric plates 22 and 24 are fixed substantially at the centers of the elastic support plates 26 and 28, respectively. The piezoelectric plates 22 and 24 are fixed on a frame 29 (having the shape illustrated) such that the plates 22 and 24 can vibrate along the directions indicated by arrows 30. A voltage applied to the piezoelectric plates 22 and 24 is controlled to vibrate the piezoelectric plates 22 and 24 in the same vibration mode (i.e., their displacement and vibrating direction are the same at any given time).

A film connector 32 is adhered to the lower surface of the IT-CCD 20. This film connector 32 has a connector body 32-1, a pair of parallel integral C-shaped leg portions 32-2 and 32-3 which are formed on both lateral sides of the connector body 32-1, and a plurality of connection members 34 which are made of conductive rubber. In the C-shaped leg portions 32-2 and 32-3, wiring patterns 36 are formed as needed to conform to the C-shape of the leg portions 32-2 and 32-3. The IT-CCD 20 is fixed by an adhesive to the long side surfaces of the piezoelectric plates 22 and 24. The frame 29 is mounted with the piezoelectric plates 22 and 24 on a baseboard 38; and the C-shaped leg portions 32-2 and 32-3 are bent so that the respective connecting members 34 are properly brought into contact with printed conductive films 40 formed on the top surface of the baseboard 38. The conductive films 40 are connected by a known technique to the connecting pins 42, respectively.

A micro-chip capacitor device 46 which serves as a temperature-compensation capacitor is adhered to the piezoelectric plate 22. The adhesion position of the capacitor device 46 on the plate must satisfy the following conditions: (1) the capacitor device 46 will not interfere with the vibration of the piezoelectric plate; and (2) the capacitor device 46 will effectively detect a change in ambient temperature. Referring to FIG. 7, the capacitor device 46 was cemented to the central area of the side surface of the piezoelectric plate 22. The electrical connection between the capacitor device 46 and the piezoelectric plate 22 was performed in the same manner as described with reference to FIGS. 1 and 2. The temperature-compensation capacitor device (not shown in FIG. 7) was cemented to the piezoelectric plate 24 in the manner described above.

According to the embodiment shown in FIG. 7, the piezoelectric elements or vibrators 22 and 24 are held as if they are substantially floating in air and are positioned on the baseboard 38 such that the elements 22 and 24 are not firmly coupled to any other member. Therefore, a vibration displacement of the piezoelectric elements 22 and 24 per unit voltage applied thereto is ideally increased, so that the IT-CCD 20 can be effectively swung so as to contribute greatly to the high resolution of the CCD pickup image. In addition, the micro-chip capacitors 46 which serve as temperature-compensation electric elements are adhered to the piezoelectric vibrators 22 and 24, respectively. For the same reason as in the first embodiment, the IT-CCD-20 can be stably vibrated in the desired vibration mode in a simple arrangement without incorporating any other electrical circuit and irrespective of a change in ambient temperature. Since the micro-chip capacitor device can be used as the necessary temperature compensation electrical element, the element can be easily housed in a CCD package, thereby further simplifying the construction of the device as a whole.

Although the present invention has been shown and described with respect to particular embodiments, various changes and modifications which are obvious to a person skilled in the art to which the invention pertains are deemed to lie within the spirit and scope of the invention.

In the above embodiments, a parallel-connected bimorph piezoelectric element is used in the displacement generation section. However, a bimorph piezoelectric element having plates whose polarization directions are opposed may be used. In addition, the piezoelectric plates are not limited to two; the piezoelectric element may have only one piezoelectric plate, or three or more piezoelectric plates. Furthermore, the piezoelectric plates may be fixed on a metal plate or the like as needed.

It should be noted that the piezoelectric displacement generation element may be made of a parallel type element or a transverse type element. In the parallel type element, when an electric field is applied in the same direction as the polarization direction of the element, the thickness of the element is increased. When elements of this type are stacked they obtain a large displacement ($d_{33}$ or $k_{33}$). On the other hand, in the transverse type element, when an electrical field is applied in a direction perpendicular to the polarization direction, a slip-like displacement occurs. Elements of this type are stacked to obtain a high amplification ($d_{15}$ or $k_{15}$). According to the present invention, the bimorph, parallel or transverse type piezoelectric element can be used as needed.

What is claimed is:

1. A device for generating periodical displacement to swing or vibrate a solid-state image sensor, said device comprising:
    (a) a piezoelectric element adapted to be mechanically coupled to said image sensor and having an electrostatic capacitance with a predetermined temperature coefficient, said piezoelectric element receiving an AC drive voltage to generate, in response to the AC drive voltage, the periodical displacement which causes said image sensor to swing or vibrate continuously during its image sensing operation; and
    (b) capacitor means, electrically connected in series with said piezoelectric element and having an electrostatic capacitance with a temperature coefficient whose sign is opposite to that of the predetermined temperature coefficient, and whose value is selected such that the AC drive voltage applied to said piezoelectric element when the electrostatic capacitance of said piezoelectric element changes with a change in ambient temperature compensates for a change in the vibration amplitude of the swinging image sensor caused by the change in ambient temperature, whereby said image sensor is allowed to swing at a uniform vibration amplitude irrespective of the ambient temperature.

2. The device of claim 1, wherein said piezoelectric element is formed of a ceramic material.

3. A device according to claim 1, wherein said piezoelectric element comprises a bimorph piezoelectric element.

4. A device according to claim 1, wherein said electrical element means comprises a parallel type piezoelectric element.

5. A device according to claim 1, wherein said electrical element means comprises a transverse type piezoelectric element.

6. A device according to claim 1, wherein the temperature coefficient of the capacitance of said capacitor element is substantially equal to:

$$-\frac{C1(T0)}{C(T0)} \cdot \alpha_C$$

where
   $\alpha_C$: the predetermined temperature coefficient of the electrostatic capacitance of said piezoelectric element
   $T0$: a reference temperature
   $C1(T0)$: an electrostatic capacitance of said capacitor element at the reference temperature $T0$
   $C(T0)$: an electrostatic capacitance of said piezoelectric element at the reference temperature $T0$.

7. A device according to claim 4, wherein the electrostatic capacitance $C1(T0)$ of said capacitor element at the reference temperature $T0$ is set to be equivalent to the electrostatic capacitance $C(T0)$ of said piezoelectric element at said reference temperature $T0$, so that the temperature coefficient of the capacitance $C1(T0)$ of said capacitor element has substantially the same absolute value as that of the temperature coefficient $\alpha_C$ of the capacitance of said piezoelectric element but has an opposite sign thereto.

8. A device according to claim 1, wherein the temperature coefficient of the capacitance of said capacitor element is substantially equal to:

$$-\frac{C1(T0)}{C(T0)} \cdot \alpha_S$$

where
   $\alpha_S$: a temperature coefficient of the displacement of said piezoelectric element
   $T0$: a reference temperature
   $C1(T0)$: an electrostatic capacitance of said capacitor element at the reference temperature $T0$
   $C(T0)$: an electrostatic capacitance of said piezoelectric element at the reference temperature $T0$.

9. A device according to claim 8, wherein the electrostatic capacitance $C1(T0)$ of said capacitor element at the reference temperature $T0$ is set to be equivalent to the electrostatic capacitance $C(T0)$ of said piezoelectric element at the reference temperature $T0$, so that the temperature coefficient of the capacitance $C1(T0)$ of said capacitor element has substantially the same absolute value as that of the temperature coefficient $\alpha_S$ of the displacement of said piezoelectric element but has an opposite sign thereto.

10. A solid-state image sensing device comprising:
    (a) a solid-state image sensor which receives image light incident thereon having means to provide an electrical image pickup signal corresponding to the image light;
    (b) piezoelectric element means, mechanically coupled to said image sensor, for receiving an externally applied AC drive voltage and for vibrating said image sensor in response to the AC drive voltage so as to cause said image sensor to periodically vibrate in conformity with relative positions of said image sensor and the image light, said piezoelectric element means having an electrostatic capacitance with a predetermined temperature coefficient; and
    (c) capacitor means, electrically connected in series with said piezoelectric element means and having an electrostatic capacitance with a temperature coefficient whose sign is opposite to that of the predetermined temperature coefficient, for properly changing the drive voltage to be applied to said piezoelectric element means when the electrostatic capacitance of said piezoelectric element means changes in accordance with a change in ambient temperature, thereby causing said piezoelectric element means to generate a periodic displacement so as to keep the periodic displacement constant independently of the change in ambient temperature.

11. A device according to claim 10, wherein said capacitor means comprises a capacitor element.

12. A device according to claim 11, wherein said piezoelectric element means comprises a bimorph piezoelectric element formed in a rectangular plate shape.

13. A device according to claim 10, wherein said piezoelectric element means comprises a parallel type piezoelectric element.

14. A device according to claim 10, wherein said piezoelectric element means comprises a transverse type piezoelectric element.

* * * * *